(12) United States Patent
Schmidt

(10) Patent No.: US 11,688,894 B2
(45) Date of Patent: Jun. 27, 2023

(54) MONITORING BATTERIES FOR A FAULTY, PROBLEMATIC, OR CRITICAL STATE

(71) Applicant: Bayerische Motoren Werke Aktiengesellschaft, Munich (DE)

(72) Inventor: Jan Philipp Schmidt, Holzmaden (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 89 days.

(21) Appl. No.: 17/251,377

(22) PCT Filed: May 27, 2019

(86) PCT No.: PCT/EP2019/063579
§ 371 (c)(1),
(2) Date: Dec. 11, 2020

(87) PCT Pub. No.: WO2019/238396
PCT Pub. Date: Dec. 19, 2019

(65) Prior Publication Data
US 2021/0257678 A1 Aug. 19, 2021

(30) Foreign Application Priority Data
Jun. 12, 2018 (DE) .................. 10 2018 209 324.5

(51) Int. Cl.
*H01M 10/06* (2006.01)
*H01M 10/44* (2006.01)
(Continued)

(52) U.S. Cl.
CPC .......... *H01M 10/445* (2013.01); *G01R 31/36* (2013.01); *H01M 10/443* (2013.01);
(Continued)

(58) Field of Classification Search
CPC ............ H01M 10/445; H01M 10/443; H01M 10/446; H01M 10/441; H01M 10/486;
(Continued)

(56) References Cited

U.S. PATENT DOCUMENTS 6,437,542 B1 8/2002 Liaw et al.
9,307,889 B1 * 4/2016 Daniel .................. H05B 3/26
(Continued)

FOREIGN PATENT DOCUMENTS

CN 104234703 * 3/2017 ............ E21B 47/117
DE 10 2010 046 307 A1 3/2012
(Continued)

OTHER PUBLICATIONS

Machine-generated translation of EP 3179532, Pascal et al., "Glass-Metal Sealed Feed-Through, Use as Lithium Electrochemical Battery, Associated Production Method", Jun. 14, 2017.*
(Continued)

*Primary Examiner* — Raymond Alejandro
(74) *Attorney, Agent, or Firm* — Crowell & Moring LLP

(57) ABSTRACT

A method for monitoring a battery cell is provided. The method measures a first value corresponding to a pressure inside the battery cell. The method also determines a second value on the basis of the first value. The second value corresponds to a temperature of the battery cell. The method monitors the battery cell on the basis of the second value. It is possible to determine whether the battery cell is in a fault-free state or in a state which is faulty, problematic, or critical.

6 Claims, 7 Drawing Sheets

(51) Int. Cl.
*G01R 31/36* (2020.01)
*H01M 10/48* (2006.01)

(52) U.S. Cl.
CPC ......... *H01M 10/48* (2013.01); *H01M 10/486* (2013.01); *H01M 2200/20* (2013.01)

(58) Field of Classification Search
CPC ............... H01M 10/482; H01M 10/48; H01M 2200/20; G01R 31/36
See application file for complete search history.

(56) References Cited

U.S. PATENT DOCUMENTS

| | | | |
|---|---|---|---|
| 9,356,325 B1* | 5/2016 | Poirier | H01M 10/48 |
| 2006/0246345 A1 | 11/2006 | Yoon et al. | |
| 2013/0236755 A1 | 9/2013 | Goldberg et al. | |
| 2014/0170446 A1 | 6/2014 | Elian et al. | |
| 2014/0368209 A1 | 12/2014 | Henrici | |
| 2016/0107537 A1 | 4/2016 | Marchal et al. | |

FOREIGN PATENT DOCUMENTS

| | | | |
|---|---|---|---|
| DE | 10 2012 223 708 A1 | 6/2014 | |
| DE | 10 2013 113 909 A1 | 6/2014 | |
| DE | 10 2016 100 760 A1 | 7/2016 | |
| EP | 3179532 * | 6/2017 | ............. H01M 2/06 |
| WO | WO 2013/072281 A2 | 5/2013 | |

OTHER PUBLICATIONS

Machine-generated translation of CN 104234703, Liang et al., "A Well Control Pressure Stoling Device and Stoling Method", Mar. 15, 2017.*
International Search Report (PCT/ISA/210) issued in PCT Application No. PCT/EP2019/063579 dated Aug. 12, 2019 with English translation (four (4) pages).
German-language Written Opinion (PCT/ISA/237) issued in PCT Application No. PCT/EP2019/063579 dated Aug. 12, 2019 (five (5) pages).
German-language Search Report issued in German Application No. 10 2018 209 324.5 dated May 10, 2019 with partial English translation (11 pages).

* cited by examiner

MONITORING BATTERIES FOR A FAULTY, PROBLEMATIC, OR CRITICAL STATE

BACKGROUND AND SUMMARY OF THE INVENTION

The present invention relates to the monitoring of batteries. The invention relates in particular to the monitoring of a battery cell for a critical state. The invention is used in particular for lithium-ion cells, but is not restricted thereto. The invention can be used in particular in connection with vehicle batteries, in particular high-voltage stores that are (also) used for the drive of a vehicle, either in combination with an internal combustion engine or as a purely electrical drive of the vehicle. The invention is not limited in this respect either, however.

It is known from the prior art that a (gas) pressure sensor can be used to detect the overcharging of battery cells. Examples in this regard are U.S. Pat. No. 6,437,542B1, US2006/0246345A1, DE102013113909A1, DE102010046307A1 and DE102012223708A1. These known approaches involve determining whether the pressure in the battery cell exceeds a previously defined value.

The inventor of the present invention has recognized that the pressure inside a battery cell is (highly) dependent on the temperature. In this context, the inventor has recognized that approaches in the prior art involve the previously defined pressure threshold value (critical pressure) being set relatively high in order to keep down the number of false detections of a critical state (false-positives). This is because if the threshold value for the critical pressure is set too low, this value can be reached or exceeded even for normal operating states, depending on the temperature of the battery cell. Furthermore, the pressure in the cell increases during service life, which means that a low choice of fixed threshold can itself lead to a false detection. On the other hand, the inventor has recognized that a threshold value set relatively high for the critical pressure entails the risk of a critical state being detected relatively late and possibly too late.

Against this background, it is an object of the invention to provide an alternative for monitoring battery cells or to improve the monitoring of battery cells.

This is achieved according to the invention by the teaching of the independent claims. Preferable embodiments and developments of the invention are the subject of the subclaims.

A first aspect of the invention relates to a method for monitoring a battery cell, comprising: measuring a first value that corresponds to a pressure prevalent inside the battery cell; determining a second value based on the first value, wherein the second value corresponds to a temperature of the battery cell; and monitoring the battery cell based on the second value.

The inventor has recognized that, at least for some types of battery cells, there is a relationship between a pressure (in particular gas pressure) prevalent inside the battery cell and a temperature inside the battery cell (in particular in the cell roll or cell stack). This relationship can be used according to the invention to determine a second value, which corresponds to the temperature inside the battery cell, based on the measured first value, which corresponds to the pressure.

According to one embodiment, the second value is determined on the basis of a relationship between the pressure and the temperature of the battery cell based on the first value, wherein the relationship between the pressure and the temperature of the battery cell is prevalent while the battery cell is in a normal state.

According to this embodiment, the term "normal state" is intended to be understood to mean a state of the battery cell in which the battery cell operates or can operate substantially faultlessly and/or is not overloaded and/or overcharged and/or experiences no or only a very slight inhomogeneous heating/cooling. While the battery cell is in a normal state of this kind, the relationship between pressure and temperature can be determined by measurement series, for example. The inventor has recognized that the relationship between pressure and temperature can be regarded as linear at least over a subrange, which means that this relationship can be approximated by a linear function. A linear relationship of this kind makes determining the second value based on the first value particularly simple. It is just as simple to determine the relationship, which can be stored in the battery or associated control units, for example, so that this relationship can be used to determine the second value based on the first value. By way of example, it would suffice to measure two different pairs of pressures and associated temperatures in order to determine the linear relationship between the pressure (p) and the temperature (T) therefrom. Mathematically, this relationship can be expressed as $T = m \cdot p + c$, the values for m and c being able to be determined by the two aforementioned measurements.

Nevertheless, the invention also provides the option for the relationship between the temperature and the pressure to be approximated not by a linear function but rather by a function that also has quadratic terms or higher-order terms, for example. Although the description that follows is largely restricted to linear relationships, it should be noted that the determination of a nonlinear relationship and the subsequent use of such a relationship can take place in an analogous manner, but more than two measurements would then generally be necessary in order to determine the relationship between pressure and temperature (calibration).

According to one embodiment, the relationship between the pressure and the temperature of the battery cell takes into consideration the state of charge of the battery cell and/or the service life and/or the state of ageing of the battery cell.

In respect of the service life or the state of ageing of the battery cell, the inventor has recognized that although the relationship between pressure and temperature inside a battery cell can be regarded as linear, this relationship can change over the course of time, that is to say over the service life of the battery cell. This change is relatively slow (for example in comparison with a charging and discharge cycle for average use of a battery cell in an electrically driven vehicle), however, which means that it is generally sufficient to adjust the relationship between pressure and temperature at an interval of a few days, for example.

In order to take into consideration the service life of the battery cell, it is possible to take into consideration the age according to the calendar, for example. Additionally or alternatively, it is possible to take into consideration a state of ageing of the battery cell, for example based on a history of use.

According to one embodiment, the service life/state of ageing of the battery cell is taken into consideration by virtue of the or a relationship between pressure and temperature being corrected on the basis of an determined further temperature.

In this case the further temperature is not (or at least not only) determined based on the measured pressure. The determined further temperature can then be used to check whether the stored (linear) relationship between pressure and temperature is still consistent with reality. If this is not the case the relationship can be corrected accordingly, i.e.

when the aforementioned linear function is used the values for m and/or c can be adjusted accordingly. In this instance it is advisable to again perform at least two temperature measurements.

The at least one further temperature is preferably determined at a time at which it can be expected that the further temperature corresponds substantially to the actual temperature inside the battery cell.

The inventor has recognized that the use of external temperature sensors (for example on a battery terminal) for determining a temperature inside the cell can lead to erroneous results in particular if the battery cell is being charged or discharged. Nevertheless, the inventor has recognized that an external temperature sensor can deliver perfectly reliable results at other times. In other words, at such times it can be expected that a further temperature determined by an external temperature sensor, for example, corresponds substantially to the actual temperature inside the battery cell, which means that a further temperature determined in this manner may be perfectly suitable for correcting the relationship between pressure and temperature, that is to say for (re) calibration.

In respect of the state of charge of the battery cell the inventor has found that even after a thermal equilibrium has become established (that is to say for example after a sufficiently long "cooling phase" after a charging or discharge process) a pressure difference for two pressure measurements at the same temperature is obtained that is simply attributable to the state of charge of the battery cell. This pressure difference is admittedly comparatively small and is therefore negligible in principle. On the other hand, the invention's determining of a second value based on the first value is even more accurate if the pressure difference on account of the state of charge of the battery is taken into consideration. In order to take into consideration the state of charge it is possible to proceed in a manner analogous to the above-described approach for taking into consideration the service life of the battery cell, that is to say (re)calibration on the basis of measurements of pressure and temperature for different states of charge. Similarly, the influence of the state of charge of the battery cell on the relationship between pressure and temperature inside the battery cell can be determined and stored in the battery cell or an associated control unit during the development of the battery cell, for example.

According to one embodiment, the monitoring of the battery cell based on the second value comprises determining whether the second value is the same as or exceeds a first threshold value.

Although the second value corresponds to a temperature value, this embodiment differs from a conventional measurement of a temperature of the battery cell and subsequent comparison with a threshold value. This becomes clear in particular in the event of an inhomogeneous heating of the battery cell. An inhomogeneous heating of the battery cell would, according to the insight of the inventor, often be manifested by a marked pressure rise, which can be detected by a pressure meter without significant delay on the basis of the free pressure distribution inside the battery cell. On the other hand, according to the insight of the inventor, a heating of the battery cell, in particular an inhomogeneous heating, would become noticeable only after a certain delay in the case of a conventional temperature measurement (in particular a cell-external temperature measurement). This embodiment of the invention can thus allow more timely monitoring of the battery cell.

In a faulty or problematic or critical state of the battery cell, further effects may arise instead of or in addition to an inhomogeneous heating/overheating if necessary. Such effects can also lead to a release of gas, which means that the gas pressure is not only dependent on a temperature of the battery cell. In the event of an overcharging, the gas pressure can rise as a result of the gas-forming decomposition of additives or the electrolyte or even the electrode(s) of the battery cell, for example. In the event of very intense (local) heating, where temperatures above 80° C. are produced, for example, the gas pressure could rise on account of decomposition and re-formation reactions of the SEI (solid electrolyte interface) at the anode. These contributions to the pressure rise then lead to a faster rise in the derived second value and hence also to an earlier arrival at the first threshold value.

In view of the effects just described, it can be seen that although the second value (derived from the measured pressure) corresponds to a temperature value in principle, this temperature value does not necessarily have to be the same as an actual temperature of the battery cell. The second value could be regarded as a virtual temperature value of the battery cell in some ways.

According to one embodiment, the method furthermore comprises measuring a third value that corresponds to a temperature in or on the battery cell.

Such a temperature measurement can be used as a control measurement, as described below.

According to one embodiment, the first value and the third value are determined by two substantially mutually independent measurements.

The meaning in this case is preferably that the third value is not just derived from the first value in a computational manner. Nevertheless, the two measurements can be performed by a combined measuring instrument, such as e.g. an MEMS gas pressure sensor, that can measure both pressures and temperatures.

According to one embodiment, the monitoring of the battery cell based on the second value comprises monitoring the battery cell based on a difference between the second value and the third value.

Such a difference can be an indication of a previously mentioned inhomogeneous heating of the battery cell or of another problem, for example. The greater the difference, the more likely it is that there is an inhomogeneous heating or another problem.

Accordingly, according to one development, the monitoring of the battery cell based on the difference between the second value and the third value comprises determining whether the difference or the absolute value of the difference is the same as or exceeds a second threshold value.

Although the second threshold value (like the first threshold value) can be defined in advance, the use of a defined first or second threshold value of this kind differs from the use of a fixed threshold value for a critical pressure according to the prior art, as mentioned at the outset, because the value that is compared with the first or second threshold value does not just correspond to the pressure but can also take into consideration other factors (state of charge, service life, etc.).

According to one embodiment, the state of the battery cell is regarded as associated with, and in particular the state of the battery cell is assigned to:
  a first category if the second value is lower than the first threshold value, and a second category if the second value is the same as or exceeds the first threshold value, or the first category if the difference or the absolute value thereof between the second value and the third value is lower than the second threshold value, and the second category if this difference or the absolute value thereof is the same as or exceeds the second threshold value, or the first category if both the second value is lower than the first threshold value and the difference or the absolute value thereof between the second value and the third value is lower than the second threshold value, and otherwise the second category.

This embodiment thus affords three options for classifying the state of the battery cell in two categories. According to the first variant, classification is performed only on the basis of the temperature value derived from the measured pressure. According to the second variant, the classification is effected only on the basis of the difference between the temperature value derived from the pressure and the measured temperature value. The third variant combines the first two variants to a certain degree, wherein the classification into the first category is effected only if both the second value and the difference or the absolute value thereof is lower than the first or the second threshold value.

According to one embodiment, the first category is a substantially or sufficiently faultless state of the battery cell and the second category is a faulty, in particular problematic, in particular critical, state of the battery cell.

This embodiment thus allows the detection of a faulty, in particular problematic, in particular critical, state of the battery cell on the basis of the aforementioned variants.

According to one embodiment, a signal, in particular a warning signal, is output and/or an action is performed if the state of the battery cell is regarded as associated with, in particular is assigned to, the second category, wherein the action preferably comprises at least one of the following steps:

disconnecting the battery cell, reducing a charging current with which the battery cell is charged, in particular to zero, reducing a discharge current with which the battery cell is discharged, in particular to zero, opening a valve, boosting the cooling or initiating an emergency cooling.

It is thus possible for a signal to be output that can serve for example an operator of the battery cell as a warning signal so that measures can be initiated if necessary in order to counteract the detected faulty, in particular problematic, in particular critical, state of the battery cell. On the other hand, it is also possible however for an action to be performed (automatically) in order to (automatically) counteract the detected problem, etc.

A second aspect of the invention relates to a sensor arrangement for monitoring a battery cell, having: means for measuring a first value that corresponds to a pressure prevalent inside the battery cell; means for determining a second value based on the first value, wherein the second value corresponds to a temperature of the battery cell; and means for monitoring the battery cell based on the second value.

A third aspect of the invention relates to a battery cell, having a sensor arrangement as described above.

A fourth aspect of the invention relates to a vehicle, having a battery cell as described above.

The advantageous refinements and embodiments presented with reference to one of the aspects of the invention (method, sensor arrangement, battery cell and vehicle) and the advantages of said refinements and embodiments also apply accordingly to the invention's other aspects of the invention.

Further advantages, features and opportunities for use of the present invention will become apparent from the claims, the figures and the description of the figures. All of the features and combinations of features cited in the description above and the features and combinations of features cited in the description of the figures below and/or shown in the figures alone can be used not only in the respectively indicated combination but also in other combinations or on their own, provided that these combinations are implementable.

The invention will now be explained in more detail on the basis of a few preferred exemplary embodiments and with reference to the accompanying drawings, where functionally identical or functionally similar components are provided with the same reference signs.

DETAILED DESCRIPTION OF THE DRAWINGS

Figure 1:
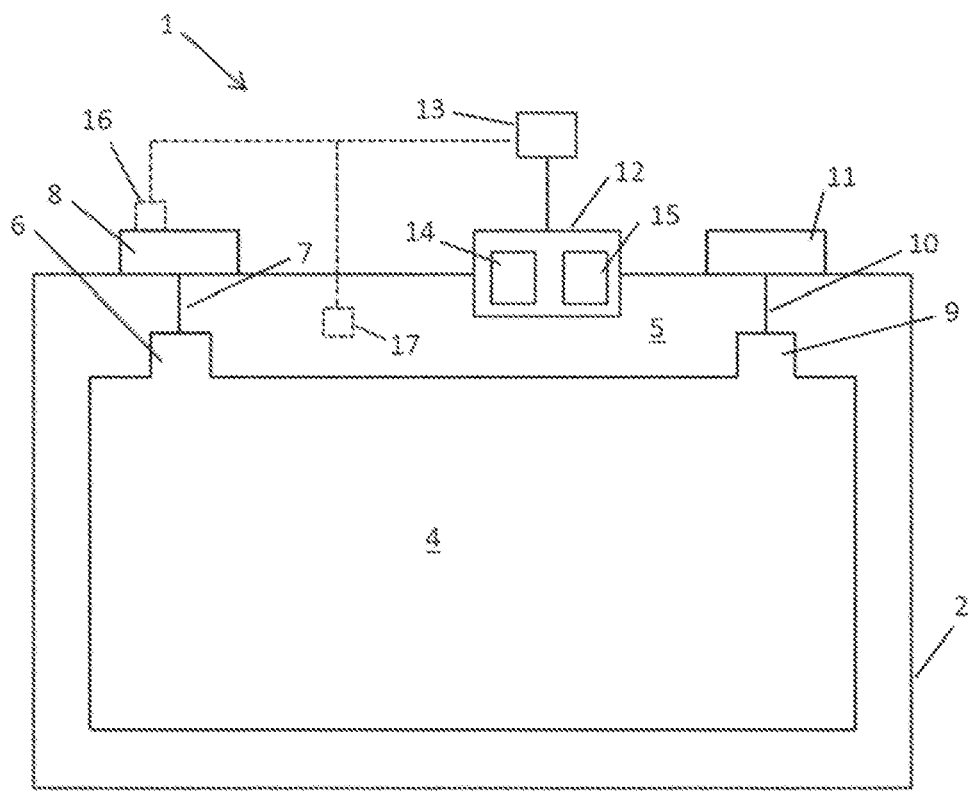
FIG. 1 shows a battery cell having a sensor arrangement according to an exemplary embodiment of the invention.

FIG. 1 shows the design of a battery cell 1 having a sensor arrangement according to an exemplary embodiment in simplified form. The battery cell 1 has a casing 2 in which there is a cell roll 4 or cell stack 4. In the casing 2 there is a gas space 5 surrounding the cell roll 4 or cell stack 4. The cell roll 4 or cell stack 4 has an inner negative terminal 6 and an inner positive terminal 9. These are connected to (outer) negative and positive terminals 8, 11 in a manner known per se by electrical lines 7 and 10.

A gas pressure sensor 12 is integrated in the casing 2. This gas pressure sensor 12 could be arranged at any point in or on the battery cell 1 in principle, so long as it can measure the pressure prevalent inside the battery cell 1.

As gases can move substantially unimpeded inside the battery cell 1, that is to say in particular also from the region of the cell roll or cell stack 4 into the gas space 5 and vice versa, substantially the same pressure is prevalent everywhere inside the battery cell. Accordingly, the gas pressure sensor 12, which, as shown in FIG. 1, is integrated in the casing 2, can measure a first value that corresponds to a pressure prevalent inside the battery cell (that is to say also in the cell roll or cell stack 4). In order to keep down the technical complexity, it is advisable to arrange the gas pressure sensor outside the cell roll or cell stack 4, for example in a cover of the battery casing (top part of the casing 2).

The gas pressure sensor 12 is connected to a processor 13 or the like that can evaluate and/or store and/or process further and/or forward the measurement results. The processor 13 could alternatively also be integrated in the gas pressure sensor 12.

In the example shown the (in particular linear) relationship between the pressure prevalent inside the battery cell and the temperature of the battery cell is stored in the processor 13. In order to determine this relationship a suitable temperature sensor may be arranged in the battery cell during the development of the battery cell, for example. Such a temperature sensor (not depicted) may be arranged in the cell roll or cell stack 4, for example, in order to measure the actual temperature in the cell roll or cell stack 4 as exactly as possible. As mentioned previously, two measurement pairs for pressure and temperature (at different pressures/temperatures) are sufficient in principle in order to determine a linear relationship between the pressure and temperature inside the battery cell therefrom. It is useful for the measurement pairs to be determined while the battery cell is in a normal state.

After the relationship between pressure and temperature has been determined for a battery cell type, measurement of the pressure ("first value") by the pressure meter (sensor) 12 is sufficient for determining a second value that corresponds to the temperature inside the battery cell 1. The temperature can then be determined from the measured pressure according to the aforementioned equation. While the battery cell 1 is being used as intended, a temperature measurement in the cell roll or cell stack 4 is thus not necessary. Accordingly, it is also not necessary to provide a temperature sensor in the cell roll or cell stack 4, for example. This is not inconsistent with the aforementioned arrangement of a temperature sensor in the cell roll or cell stack 4 in order to determine the relationship between pressure and temperature: according to preferred embodiments, there is provision for a temperature sensor to be arranged in the cell roll or cell stack 4 at most during the development of a battery type, for example in a prototype. Said temperature sensor is used for determining the relationship between pressure and temperature inside a battery cell of this type. Further battery cells of this type (in particular battery cells that are intended for sale to customers) would have no temperature sensor in the cell roll or cell stack 4. Such a temperature sensor is then also not necessary because the relationship between pressure and temperature has already been determined.

Further details shown in FIG. 1 will be explained in the remainder of the description.

Figure 2:
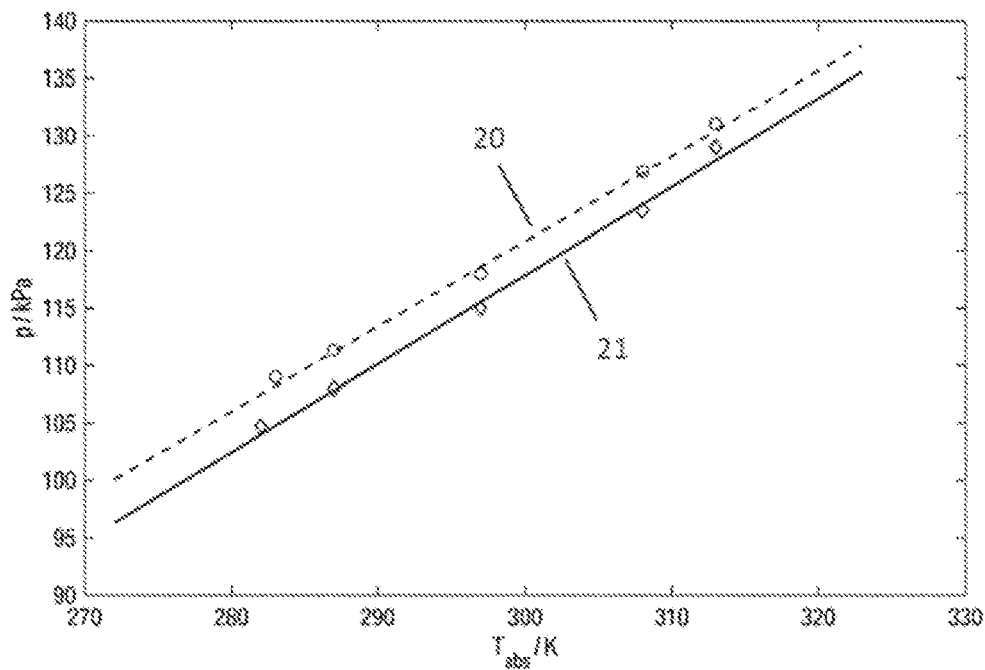
FIG. 2 shows a relationship between pressure and temperature inside a battery cell.

FIG. 2 shows the relationship between pressure and temperature inside a battery cell for two types of battery cells. Actually measured pressure and temperature values are represented by diamonds for one battery cell type and by small circles for the other battery cell type. It can be seen that the measured values each have a linear relationship for one battery cell type. Methods known per se allow straight lines 20 and 21 to be adjusted for the measured values for each of the two battery cell types. The divergence of individual measured values from the straight lines is relatively slight. From the straight lines it is possible to determine the values for m and c in the aforementioned equation.

Figure 3:
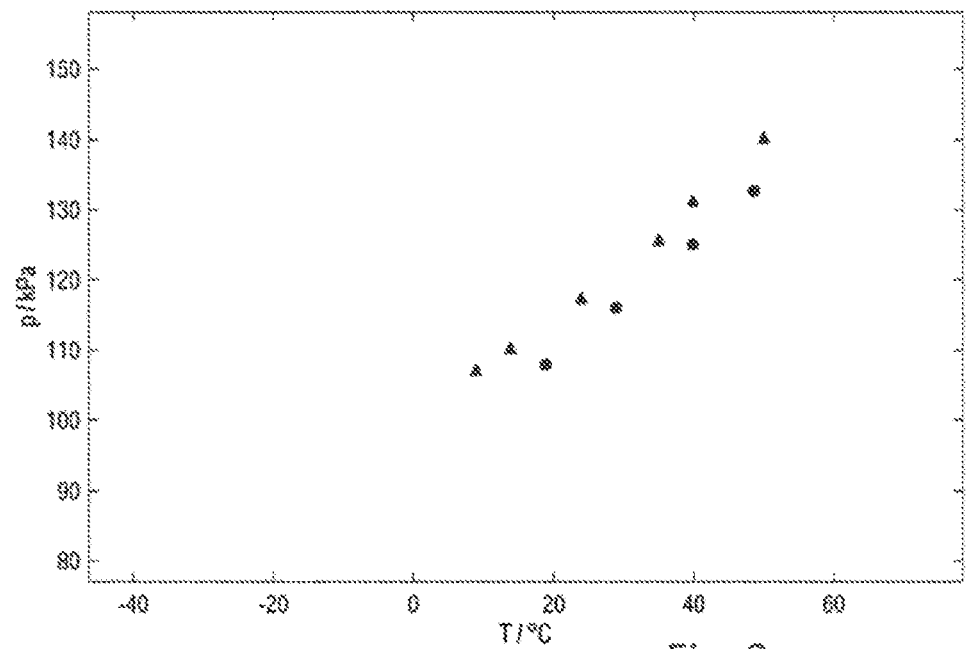
FIG. 3 shows the relationship between pressure and temperature and additionally the service life of a battery cell.

FIG. 3 shows an applicable (linear) relationship between pressure and temperature for a battery cell, wherein two measurement series have been performed at an interval of a few weeks—identified in each case by different symbols (circles and triangles). Although a distinct linear relationship can be seen in this case too, the inventor has found that the service life of the battery (age according to the calendar and/or state of ageing based on a history of use) affects this relationship, i.e. the values for m and/or c change on the basis of the service life of the battery cell. Without further measures, this would mean that the temperature of the battery cell cannot be determined (reliably) from the measured pressure. In order to counter this, exemplary embodiments of the invention provide for the service life of the battery cell to be taken into consideration. To this end, for example the processor 13 can be used to store how the service life of the battery cell affects the relationship between pressure and temperature (for example determined by measurement series), which means that the relationship between pressure and temperature that is stored in the processor 13 can be adjusted accordingly. The measurement of the pressure would then continue to allow determination of the temperature from the measured pressure (with sufficient reliability).

Additionally or alternatively, adjustment of the relationship between pressure and temperature can also be rendered possible by the (direct) measurement of a further temperature. To this end, exemplary embodiments of the invention provide for one or more temperature measurements to be performed now and then (for example at intervals of hours, days or weeks). Such a temperature measurement would preferably be effected substantially independently of, but at the same time as, a pressure measurement by the pressure meter 12. On the basis of these measured temperature and pressure values, it is possible to check whether the stored relationship between pressure and temperature (that is to say for example the values for m and c in the aforementioned equation) is still correct or consistent with reality. If need be, the relationship between pressure and temperature can then be updated on the basis of the measured temperature and pressure values.

According to exemplary embodiments of the invention, the updating of the relationship between pressure and temperature can be made more reliable if at least two pairs of temperature and pressure values are measured.

The temperature measurement can be effected at any points in or on the battery cell in principle. Although it was mentioned at the outset that temperature measurements outside the cell roll or cell stack 4, in particular outside the casing 2, can deliver incorrect results, the inventor has recognized that this is true substantially only if the battery cell is under load or is being charged or discharged or is actively being cooled or heated, in particular at high cooling or heating rates. The inventor has recognized that such operating states result in the time characteristic for the heating of the cell roll or cell stack having a different trend than on a battery cell terminal, for example, which means that the measurement of a temperature on a terminal lags behind or leads the temperature inside the battery cell, for example. Nevertheless, the inventor has found that the temperature in and on the battery cell equalizes after a sufficiently long cooling phase after such an operating state. For this reason, exemplary embodiments of the invention propose measuring the temperature on a battery cell terminal, for example, for the purpose of recalibrating the relationship between pressure and temperature, but only if such a measurement can be expected to deliver correct results. By way of example, it may be laid down that such a temperature measurement is performed only if the battery cell has substantially not been used, or at most has been operated with a stipulated or stipulable maximum charging or discharge current, during a stipulated or stipulable period of time (for example a few minutes, a few tens of minutes, an hour or a few hours).

In FIG. 1, an indication of where a temperature measurement in or on the battery cell 1 could be performed has been provided at three different points. In one exemplary embodiment, a temperature sensor 16 is arranged on the negative terminal 8 and connected to the processor 13 (depicted in dashes). Additionally or alternatively, a temperature sensor 17 could be arranged in the gas space 5 and also connected to the processor 13 (again depicted in dashes).

According to a third alternative, a temperature sensor 15 is integrated in the pressure meter 12. The pressure meter 12 could have for example a MEMS gas pressure sensor that is suitable both for measuring a pressure and for measuring a temperature (depicted by separate (sub)sensors 14 and 15). It should be borne in mind that the temperature measurement by the sensor 15 is effected substantially independently of the pressure measurement by the sensor 14. In other words, the temperature is not just derived from the measured pressure (according to the linear relationship described above), but rather is determined separately—so that the independently measured pressure and temperature values can be used to check and if necessary update the relationship between pressure and temperature.

In addition or as an alternative to the service life of the battery cell, the state of charge of the battery cell can also be taken into consideration. This is described on the basis of FIGS. 4 to 6.

Figure 4:
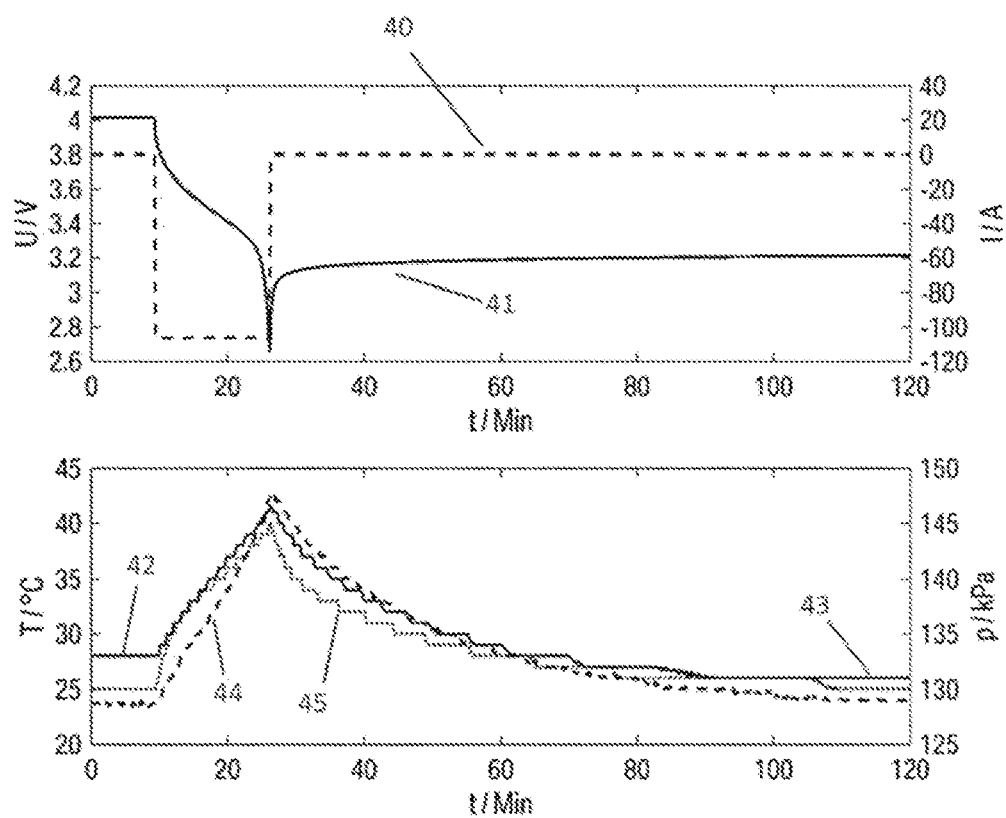
FIG. 4 shows a discharge process of a battery cell (top part of the figure) and the pressure and temperature inside the battery cell during this discharge process (bottom part of the figure)

The top part of FIG. 4 shows the time characteristic for current (dashed line 40) and voltage (solid line 41) during a discharge process of the battery cell 1. The discharge in the example shown is effected for example between the times t=10 minutes and t=28 minutes.

The bottom part of FIG. 4 shows the characteristic for the measured pressure (solid line 42 and 43), the (measured) temperature $T_{int}$ in the cell roll or cell stack 4 (dashed line 44) and the (measured) temperature on the negative terminal 8 (dotted line 45). It can be seen that the curves 44 and 45 differ (distinctly) during the discharge process and also for some time thereafter, but that they have a largely identical trend before the discharge process and distinctly after the discharge process. The inventor has additionally recognized that the measured pressure 42 before the discharge process differs from the measured pressure 43 at the end of the period shown (t=120 minutes), even though a thermal equalization has taken place at t=120 minutes and hence a pressure difference could not necessarily be expected. The inventor could attribute this to the dependency of the pressure on the state of charge (SOC).

Figure 5:
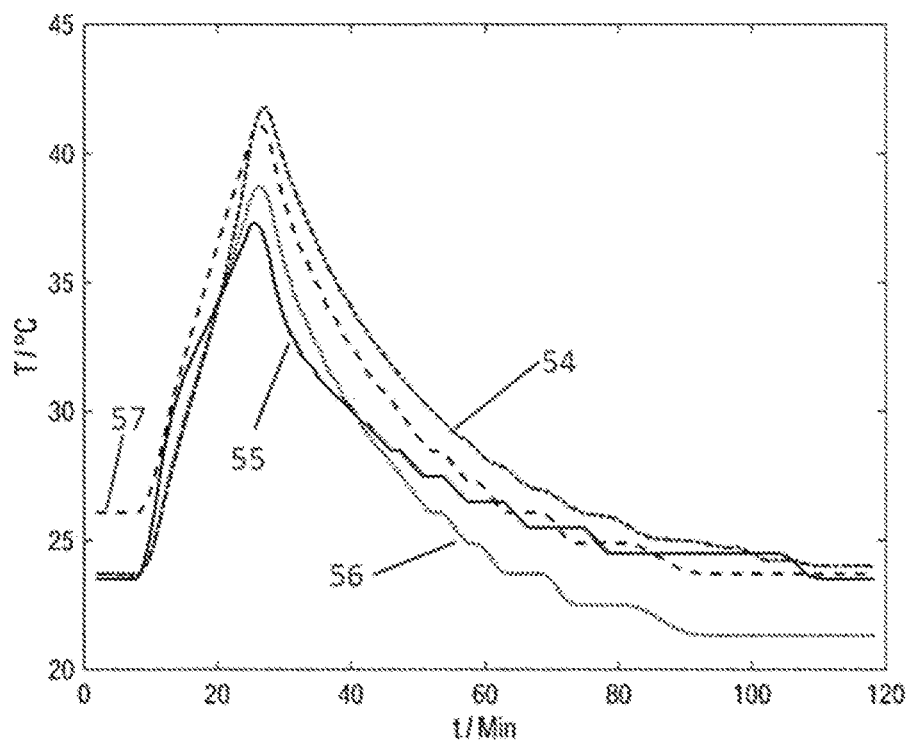
FIG. 5 shows an enlarged partial detail from the bottom part of FIG. 4.

FIG. 5 illustrates this relationship in an enlarged depiction. FIG. 5 again depicts the measured temperature in the cell roll or cell stack 4 (dash-dot line 54) and the temperature on the negative terminal 8 (solid line 55). However, FIG. 5 does not depict the measured pressure, but rather depicts two temperature curves that have been determined from the measured pressure on the basis of the aforementioned equation. The dotted line 56 in this case shows the temperature determined from the pressure if the relationship between pressure and temperature is calibrated such that the temperature derived from the pressure is largely concordant with the temperature $T_{int}$ (curve 54) in the fully charged state of the battery cell (left-hand region in FIG. 5). While the curves 54 and 56 in the left-hand region are concordant, a divergence can be seen in the right-hand region (T=120 minutes). In other words, a temperature derived from the measured pressure in this way in the discharged state of the battery cell is not as concordant with the actual temperature inside the battery cell as in the fully charged state of the battery cell.

FIG. 5 shows a further curve 57 (line with dashes at greater intervals). This curve corresponds to the curve 56, but is shifted upward, i.e. the relationship between the measured pressure and the temperature derived therefrom has been calibrated such that the temperature derived from the measured pressure in the discharged state of the battery cell is reasonably concordant with the actual temperature $T_{int}$ (curve 54) inside the battery cell (right-hand edge of FIG. 5). However, it is then again possible to see a divergence between the curves 57 and 54 at the left-hand edge of FIG. 5 (fully charged state of the battery cell).

According to some exemplary embodiments, the previously described divergences between the curve 56 and the curve 54 or between the curve 57 and the curve 54 are negligible because the divergences in the example shown are only a few degrees.

These divergences are taken into account in other exemplary embodiments, which means that the temperature derived from the measured pressure conforms to the actual temperature in the cell roll or cell stack 4 even better, in particular over all states of charge. The procedure in this regard can be analogous to that for the above-described consideration of the service life of the battery cell.

According to one exemplary embodiment, the state of charge of the battery is taken into consideration by virtue of for example measurement series during the development of the battery cell examining how the relationship between pressure and temperature inside the battery cell is dependent on the state of charge. Information obtained therefrom can be stored in the processor 13, for example in the form of a correction term that is dependent on the state of charge, for example as a result of the value c in the aforementioned equation not being a constant, but rather being dependent on the state of charge SOC of the battery cell.

In another exemplary embodiment, while the battery cell is being used as intended, the pressure and the temperature of the battery cell are measured for different states of charge. The temperature can again be measured at different locations in or on the battery cell, for example by a temperature sensor 16 on the negative terminal 8 or by a temperature sensor 17 in the gas space 5. In this case, more accurate results are again achieved if the temperature measurements are performed after a sufficiently long cooling phase, that is to say when a thermal equilibrium has become established. The information obtained from these measurements can again be stored in the processor 13.

Figure 6:
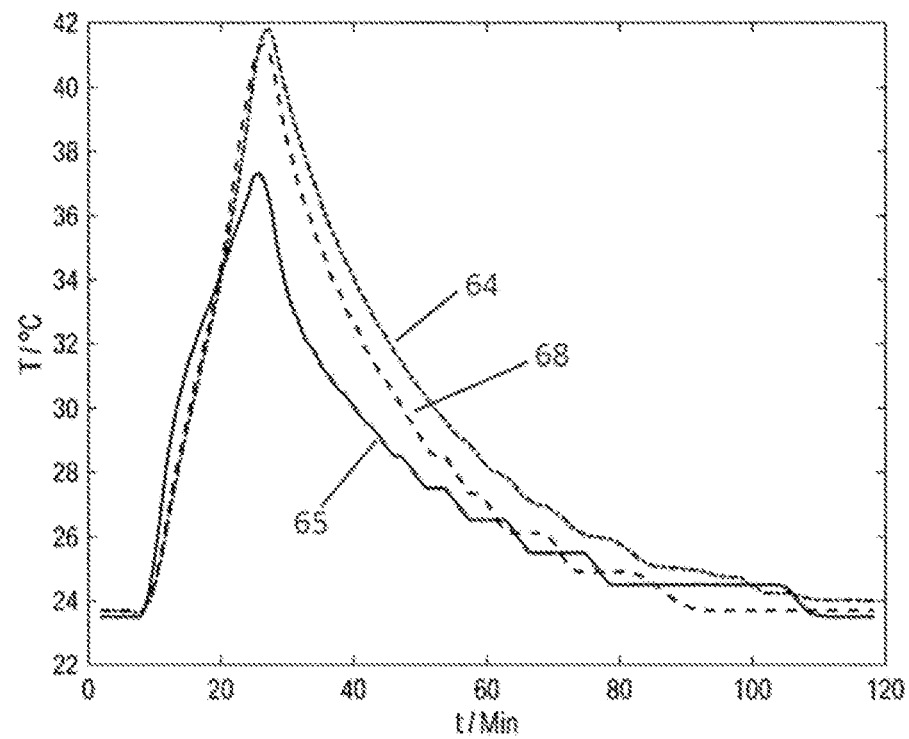
FIG. 6 shows a relationship between pressure and temperature inside a battery cell, with compensation for the state of charge.

FIG. 6 shows three temperature curves in comparison for the discharge process depicted in the top part of FIG. 4. The solid line 65 represents the temperature measured on the negative terminal 8. This corresponds to the line 55 from FIG. 5. The dash-dot line 64 in FIG. 6 reflects the measured internal temperature $T_{int}$ in the cell roll or cell stack 4. The line 64 corresponds to the line 54 from FIG. 5. Finally, FIG. 6 also shows a line 68 with dashes at greater intervals. The line 68 represents the temperature T(p) derived from the measured pressure, taking into consideration the state of charge of the battery, i.e. the temperature calculated on the basis of the aforementioned equation with a correction term c(SOC) dependent on the state of charge. The correction term c(SOC) has been determined beforehand as described above. As is clearly evident from FIG. 6, the remaining divergence between the temperature derived from the pressure (curve 68) and the temperature in the cell roll or cell stack $T_{int}$ (curve 64) is very small over all states of charge of the battery cell. In particular, the divergence between the curve 68 and the curve 64 is smaller over most regions than the divergence between the curve 65 and the curve 64.

As described on the basis of FIGS. 1 to 6 it is thus ultimately possible to determine a relationship between a pressure p prevalent in the battery cell 1 and a temperature T of the battery cell and to store said relationship in the processor 13, for example, so that this relationship can be taken as a basis for determining a temperature T(p) of the battery cell from the measured pressure p. As described previously, this relationship can take into consideration the state of charge and/or the service life/state of ageing of the battery cell. The stored relationship can then be used to monitor the battery cell, that is to say based on T(p), as described below. In this way it is possible in particular to detect faults/problems/critical states for the battery cell 1.

In order to simulate a critical state, the inventor heated a battery cell 1 on a hotplate in an experiment. The battery cell was placed on the hotplate such that it was heated on one side. Such one-sided heating simulated a scenario that can certainly arise in the form of a hotspot (intense local heating of the cell) in a similar manner when a battery cell is used as intended.

Figure 7:
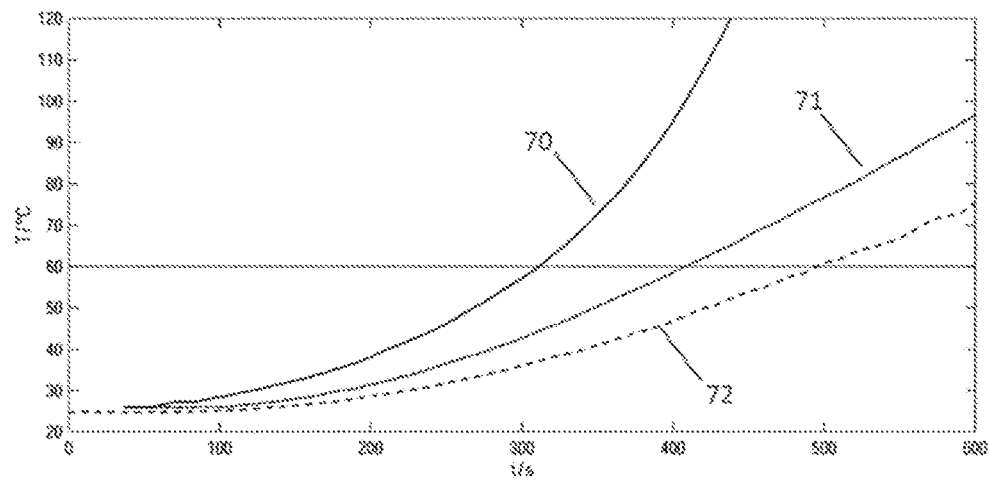
FIG. 7 shows a temperature characteristic of a battery cell as a function of time.

FIG. 7 shows a temperature characteristic for the battery cell for this experiment as a function of time. In this case the actual temperature of the battery cell has been measured at two different points: curve 71 shows the characteristic for the measured temperature $T_{int}$ in the cell roll or cell stack 4. Curve 72 shows the characteristic for the measured temperature $T_{term}$ on the negative terminal 8 of the battery cell 1. A horizontal line (60° C.) is also shown in FIG. 7. This represents a selected critical temperature Tcm that the battery cell 1 is not supposed to exceed during normal use. Finally, a curve 70 can also be seen in FIG. 7. This is not a measured temperature, but rather shows the time characteristic for a temperature T(p) derived from the measured pressure.

As can clearly be seen, all three curves 70, 71 and 72 rise over the duration of the experiment. The temperature 72 on the negative terminal rises more slowly than the temperature 71 in the cell roll or cell stack.

The arrival at or exceeding of the critical temperature of 60° C. can be used for detecting a critical state, for example in order to increase a cooling of the battery cell, to initiate an emergency cooling or to open a pressure relief valve of the battery cell. If the temperature 72 measured on the terminal were used for this purpose, the critical state would not be reached until at a time of t=500 seconds, for example. Using the temperature 71 in the cell roll or cell stack, the critical state would be reached at a time t=410 seconds, for example. At this time the local temperature at the hotspot (not depicted) would already be much higher than the critical temperature, which means that the battery cell 1 would already have been (permanently) damaged at least in the region of the hotspot, or else countermeasures such as increasing the cooling or an emergency cooling could no longer be initiated in timely fashion.

The temperature T(p) derived from the pressure, curve 70, rises much more quickly than the other two temperatures shown. According to the invention, this can be attributed to the pressure inside the battery cell rising much more quickly as a result of the local heating at the hotspot than a measured temperature in the cell roll or cell stack 4, gas space 5 or on a battery terminal would do. Additionally, upward of a certain temperature (e.g. upward of approximately 80° C.), decomposition processes would already take place in the cell, which likewise increase the gas pressure and hence the temperature determined therefrom. If, according to the experiment, the curve 70 is thus used for detecting a critical state, this critical state would already be reached or detected at a time of t=310 seconds, for example. As a result, countermeasures against the causes of the heating can already be initiated at an earlier time so as to reduce or avoid (permanent) damage to the battery cell 1.

When the battery cell 1 is used as intended it would be possible for such countermeasures to comprise for example the output of a warning signal, the disconnection of the battery cell, the reduction of a charging current (in particular to zero), the reduction of a discharge current (in particular to zero), the opening of a valve, the boosting of the cooling or the initiation of an emergency cooling.

Figure 8:
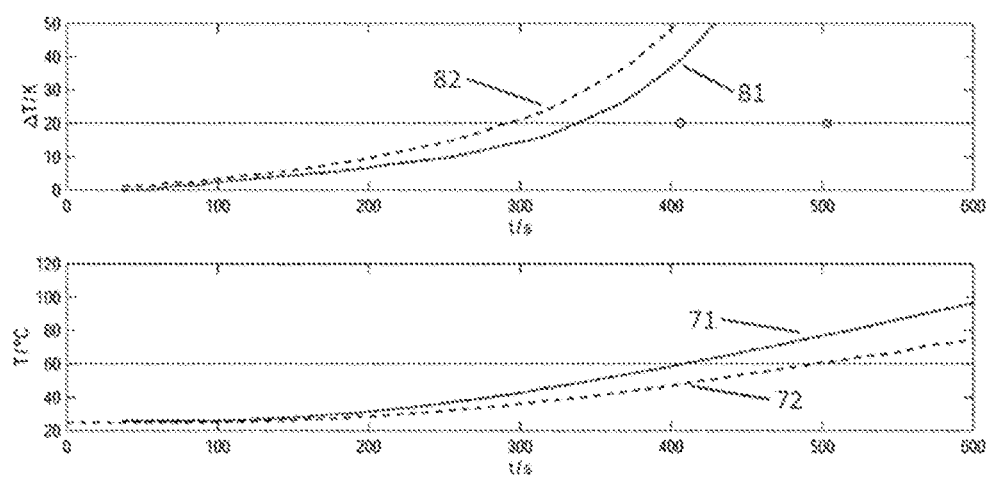
FIG. 8 shows a time characteristic for a temperature difference (top part of the figure) and for a temperature (bottom part of the figure) of a battery cell.

FIG. 8 shows a time characteristic for the experiment described above. The top part shows two curves 81 and 82. Curve 81 represents the difference between the temperature T(p) determined from the pressure and the measured temperature $T_{int}$ in the cell roll or cell stack 4. In other words, curve 81 corresponds to the difference between the curves 70 and 71 from FIG. 7, that is to say $T(p)-T_{int}$. In a similar manner, curve 82 represents the difference between the temperature T(p) derived from the measured pressure and the measured temperature on the negative terminal 8, that is to say the difference between the curves 70 and 72 from FIG. 7, $T(p)-T_{term}$. These differences can be formed after measurement of the pressure p and a further temperature (in the cell roll or cell stack or on the battery terminal), for example by the processor 13. According to exemplary embodiments of the invention, the difference formed can be used to detect a critical state or the like. This involves, as illustrated in the top part of FIG. 8 by a horizontal line at 20 K, determining whether the determined temperature difference ΔT reaches or exceeds the threshold value of $T_{th}$=20 K. If curve 81 is used for detecting a critical state, a critical state of this kind is reached or detected at approximately t=330 seconds in the example shown, and at approximately t=290 seconds already when the curve 82 is used. The use of such a difference thus sometimes allows detection of a critical state even earlier than would be permitted by the use of the temperature T(p) derived from the pressure, curve 70, without difference formation.

The bottom part of FIG. 8 once again shows the curves 71 and 72 from FIG. 7 (on a different scale in the vertical direction) for comparison. The times at which the critical state is reached on the basis of the curves 71 and 72 are also identified, for the purposes of comparison, in the top part of FIG. 8 by a circle and a square at approximately 410 seconds and 500 seconds, that is to say at a much later time than the time at which the curve 82 exceeds the temperature threshold value $T_{th}$ of 20 K.

Figure 9:
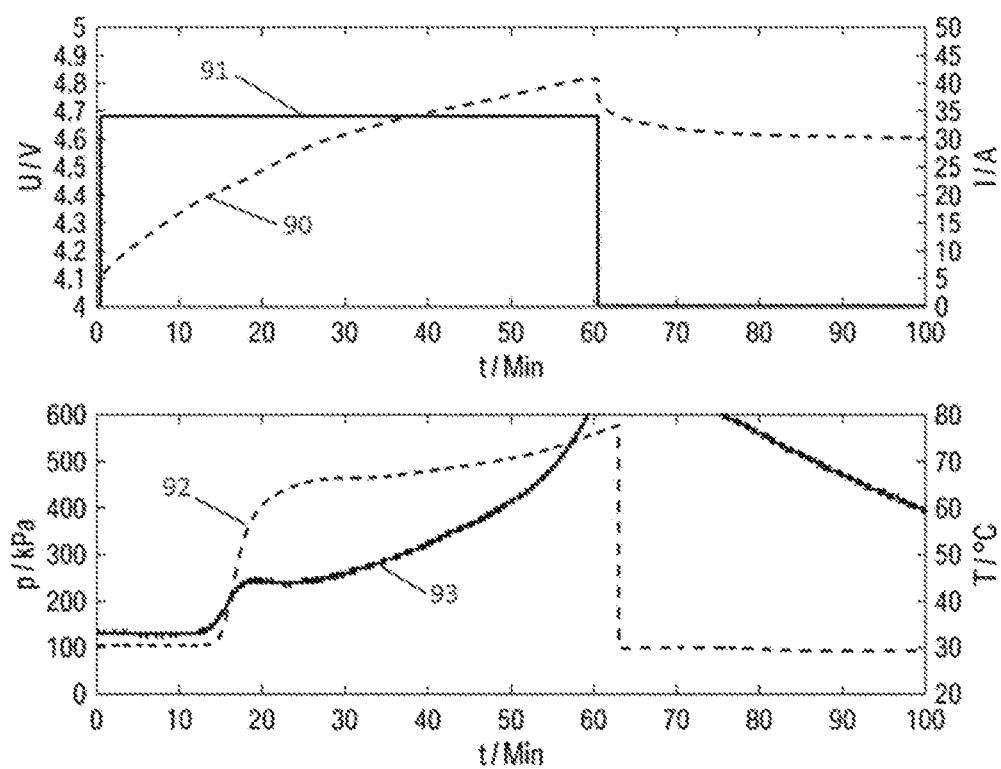
FIG. 9 shows a time characteristic for a voltage and for a current (top part of the figure) and for a pressure and for a temperature (bottom part of the figure) during a charging process of a battery cell.

FIG. 9 shows a time characteristic for a voltage (solid line 90) and a current (solid line 91) in the top part of the figure and for a pressure (dashed line 92) and a temperature (solid line 93) in the bottom part of the figure for a charging process of a battery cell that, although similar to the battery cell 1 according to the invention in principle, does not have the monitoring function according to the invention. The charging process has been intentionally designed such that the battery cell is overcharged.

The curves 92 and 93 in the bottom part of FIG. 9 show a measured pressure and a measured temperature. Both curves rise distinctly after approximately 15 minutes. However, a critical pressure or a critical temperature is not reached at first. The reason is that the critical pressure or the critical temperature has been established as relatively high so that, as mentioned at the outset, the number of false detections of a critical state can be kept down. In the example shown, a critical pressure is reached at a time of t=62 minutes, for example, resulting in a bursting membrane opening, whereupon the pressure suddenly drops. By this time, the battery cell would already have suffered irreversible damage, however.

By contrast, the use of the present invention would already have been able to report a critical state shortly after t=15 minutes, which would have reduced or avoided damage to the battery cell.

As mentioned above, FIG. 1 shows a battery cell 1 having a sensor arrangement. A sensor arrangement according to the invention is not depicted separately. Of the components shown in FIG. 1, such a sensor arrangement would have in particular the pressure meter 12 and the processor 13, possibly also a temperature sensor, such as e.g. the separate temperature sensors 16 and/or 17, and/or the temperature sensor 15 integrated in the pressure meter 12. The sensor arrangement can be provided separately, for example, for later installation or mounting in or on a battery cell 1.

According to one exemplary embodiment the processor 13 is configured such that it is able not only to determine the temperature T(p) from the measured pressure but also to calculate the aforementioned difference ΔT (or the absolute value thereof |ΔT|) between the temperature T(p) and a temperature $T_{term}$ measured by the temperature sensor 16, for example. Furthermore, the processor 13 can perform the comparison of the temperature T(p) with a critical temperature $T_{crit}$ and/or the comparison of the aforementioned difference with a threshold value $T_{th}$. Furthermore, the processor may be designed such that it determines therefrom whether the battery cell 1 is in a faulty and/or problematic and/or critical state, and can furthermore prompt the output of a warning signal or the performance of an action (for example a countermeasure in order to counter a critical state) if necessary.

Figure 10:
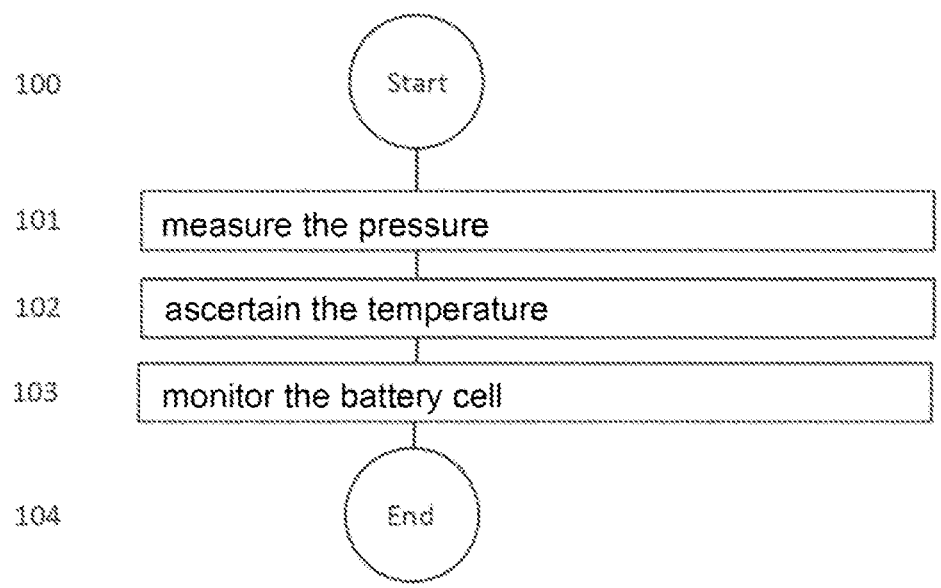
FIG. 10 shows a flowchart with method steps of a method according to an embodiment of the invention.

FIG. 10 shows a flowchart with method steps of a method according to the invention. After the start 100 of the method the pressure prevalent inside the battery cell 1 is measured in a step 101. Based on the measured pressure the temperature T(p) inside the battery cell is determined in a step 102, for example by the equation indicated above. In this instance it is assumed that the relationship between pressure and temperature inside the battery cell 1 has already been determined, which means that the temperature can be calculated from the pressure. The service life/state of ageing and the state of charge of the battery cell would also be taken into consideration if need be (not depicted as separate method steps). Subsequently, in a step 103, the battery cell is monitored based on the determined temperature T(p), in particular for arrival at a faulty, problematic or critical state. In principle the method then ends (step 104), it naturally being able to be repeated, however, in order to allow continuous monitoring of the battery cell 1.

Figure 11:
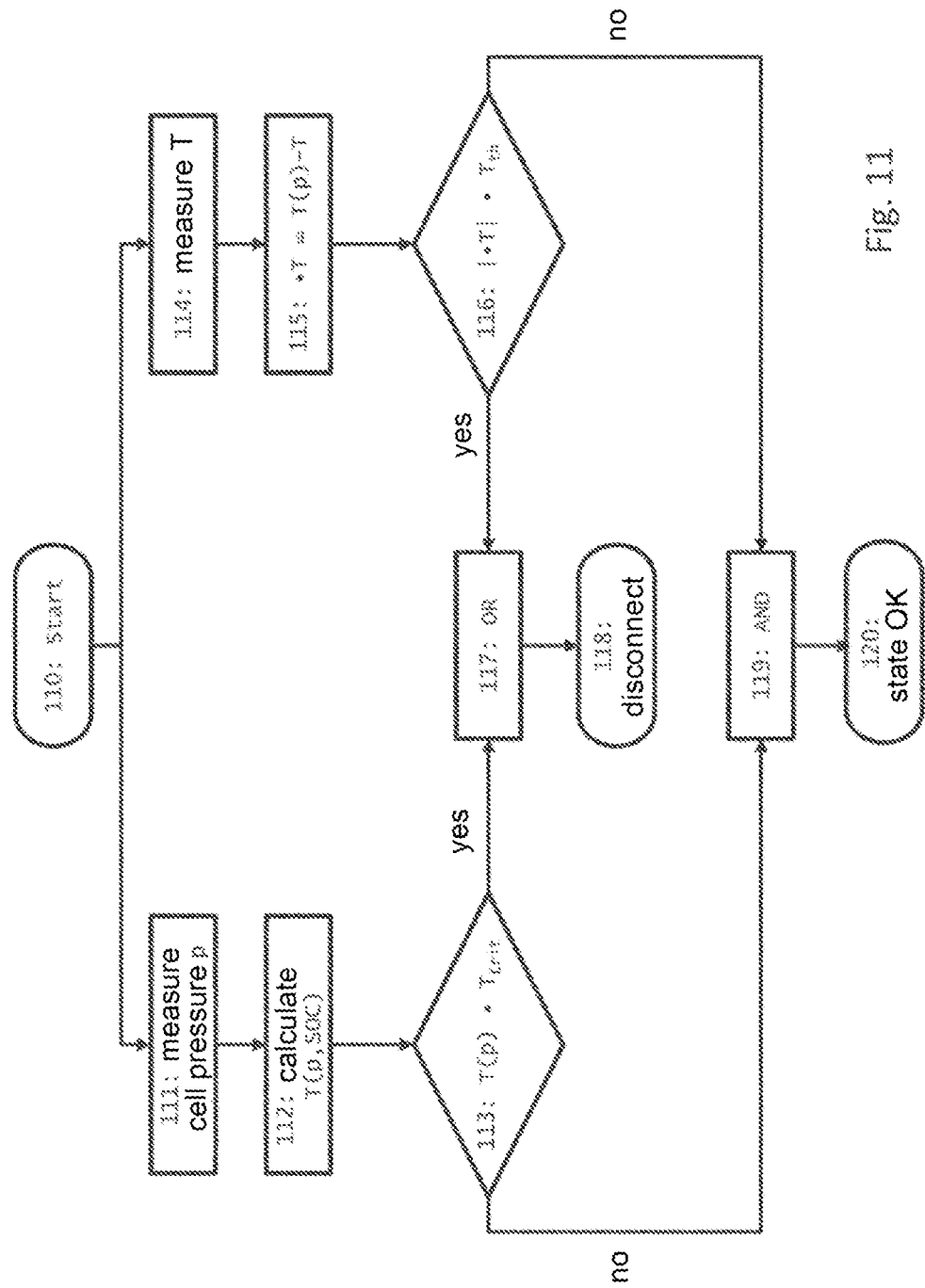
FIG. 11 shows a further flowchart with method steps of a method according to an embodiment of the invention.

FIG. 11 shows a further flowchart with method steps of a method according to the invention. This can be regarded as a development or as a more detailed depiction of the method sequence of FIG. 10.

After the start 110 of the method the cell pressure p is measured in a step 111, e.g. by the pressure meter 12. A temperature T(p) is calculated from the measured cell pressure p in step 112, e.g. by the processor 13, wherein in this case the state of charge, SOC, and/or the service life/state of ageing of the battery cell is also taken into consideration if necessary. In a further step 113 the temperature T(p) determined in this manner is compared with a critical temperature value $T_{crit}$. Additionally, in a step 114, a temperature of the battery cell is measured, for example in the cell roll or cell stack 4, in the gas space 5 or on a battery terminal. Subsequently, in a step 115, a temperature difference ΔT is formed, namely from the temperature T(p) derived from the measured pressure and the temperature T measured in step 114. Subsequently, in step 116, the temperature difference (or an absolute value of the temperature difference) is compared with a temperature threshold value $T_{th}$.

Based on the comparisons performed e.g. by the processor 13 in steps 113 and 116, an OR function is performed in step 117 or an AND function is performed in step 119. If the result of the comparison in step 113 is that the temperature T(p) is higher than or equal to a critical temperature value $T_{crit}$, OR if the result of the comparison in step 116 is that the difference ΔT (or the absolute value thereof) is higher than or equal to a temperature threshold value $T_{th}$, the OR function in step 117 leads to the battery cell 1 being disconnected in a subsequent step 118. Alternatively, other actions would also be possible (warning signal, pressure release, etc.) in step 118. Otherwise (that is to say if the temperature T(p) is lower than the critical temperature value $T_{crit}$ AND the difference ΔT or the absolute value thereof is lower than the temperature threshold value TO, the AND function in step 119 leads to the state of the battery cell being regarded as normal, or rated as normal by the processor 13, in a step 120.

In steps 118 and 120 the method can end in principle, it naturally being able to be repeated, however, in order to allow continuous monitoring of the battery cell 1.

According to one variant of this exemplary embodiment (not depicted separately) the AND and OR operations can also be interchanged in order to reduce the likelihood of a false detection.

According to further variants of this exemplary embodiment (not depicted separately) essentially only the left-hand half or the right-hand half of FIG. 11 is performed, which means that the monitoring of the battery cell 1 is effected only based on the temperature value T(p) or the difference ΔT. During monitoring based on the temperature difference ΔT, however, it is naturally also necessary to determine the temperature T(p), which means that ultimately the monitoring is effected based on the temperature T(p) in this case too. In these variants, the OR function and the AND function would be dispensed with, which means that the method leads directly to steps 118 and 120 after the comparison in step 113 or 116.

While at least one illustrative embodiment was described previously, it should be noted that a large number of variations thereof exist. It should also be remembered that the illustrative embodiments described are only nonlimiting examples and the intention is not to thereby restrict the scope, applicability or configuration of the apparatuses and methods described here. On the contrary, the preceding description will provide a person skilled in the art with guidance to implement at least one illustrative embodiment, and it goes without saying that various changes to the manner of operation and the arrangement of the elements described in an illustrative embodiment can be made without thereby departing from the subject matter respectively defined in the accompanying claims and from legal equivalents of said subject matter.

LIST OF REFERENCE SIGNS 1 battery cell
2 casing/outer wall
4 cell roll or cell stack
5 gas space
6 inner negative terminal
7 electrical connection
8 outer negative terminal
9 inner positive terminal
10 electrical connection
11 outer positive terminal
12 (gas) pressure meter/pressure sensor
13 processor
14 pressure sensor
15 temperature sensor
16 temperature sensor
17 temperature sensor
20, 21 linear relationship between pressure and temperature
40 current characteristic
41 voltage characteristic
42, 43 pressure characteristic
44, 45, 54 to 57, 64, 65, 68 temperature characteristic
70 to 72 temperature characteristic
81, 82 characteristic for a temperature difference
90 voltage characteristic
91 current characteristic
92 pressure characteristic
93 temperature characteristic
100 to 104 method steps
110 to 120 method steps

What is claimed is:

1. A method for monitoring a battery cell, comprising:
measuring a first value that corresponds to a current pressure prevalent inside the battery cell;
determining a second value based on the first value and a relationship between pressure and temperature of the battery cell, wherein the second value corresponds to a current temperature of the battery cell;
determining a state of the battery cell based on the second value; and
measuring a third value that corresponds to a temperature in or on the battery cell, wherein:
the first value and the third value are determined by two substantially mutually independent measurements,
the determining of the state of the battery cell based on the second value comprises determining a difference between the second value and the third value,
the determining of the state of the battery cell based on the second value comprises determining whether the difference or an absolute value of the difference is the same as or exceeds a second threshold value,
the determining of the state of the battery cell based on the second value further comprises determining whether the second value is the same as or exceeds a first threshold value, and
the state of the battery cell is regarded as assigned to:
a first category if the second value is lower than the first threshold value, and a second category if the second value is the same as or exceeds the first threshold value, or
the first category if the difference or the absolute value thereof between the second value and the third value is lower than the second threshold value, and the second category if this difference or the absolute value thereof is the same as or exceeds the second threshold value, or
the first category if both the second value is lower than the first threshold value and the difference or the absolute value thereof between the second value and the third value is lower than the second threshold value, and otherwise the second category.

2. The method according to claim 1, wherein
the relationship between the pressure and the temperature of the battery cell is prevalent while the battery cell is in a normal state.

3. The method according to claim 2, wherein
the relationship between the pressure and the temperature of the battery cell takes into consideration a state of charge of the battery cell, a service life, and/or a state of ageing of the battery cell.

4. The method according to claim 1, wherein
the determining of the state of the battery cell based on the second value comprises determining whether the second value is the same as or exceeds a first threshold value.

5. The method according to claim 1, wherein
the first category is a substantially faultless state of the battery cell and the second category is a faulty state of the battery cell.

6. The method according to claim 5, wherein a signal is output and/or an action is performed when the state of the battery cell is regarded as assigned to the second category, wherein the action comprises at least one of:
(i) disconnecting the battery cell,
(ii) reducing a charging current with which the battery cell is charged,
(iii) reducing a discharge current with which the battery cell is discharged,
(iv) opening a valve,
(v) increasing a cooling power or initiating an emergency cooling.

* * * * *